US006172393B1

(12) United States Patent
Kanamori et al.

(10) Patent No.: US 6,172,393 B1
(45) Date of Patent: Jan. 9, 2001

(54) NONVOLATILE MEMORY HAVING CONTACTLESS ARRAY STRUCTURE WHICH CAN RESERVE SUFFICIENT ON CURRENT, WITHOUT INCREASING RESISTANCE, EVEN IF WIDTH OF BIT LINE IS REDUCED AND CREATION OF HYPERFINE STRUCTURE IS TRIED, AND METHOD OF MANUFACTURING NONVOLATILE MEMORY

(75) Inventors: Kohji Kanamori; Yoshiaki Hisamune, both of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/287,517

(22) Filed: Apr. 7, 1999

(30) Foreign Application Priority Data

Apr. 10, 1998 (JP) .................................. 10-099212

(51) Int. Cl.⁷ .................................. H01L 29/788
(52) U.S. Cl. .......................... 257/315; 257/317
(58) Field of Search ..................... 257/315, 317

(56) References Cited

U.S. PATENT DOCUMENTS 5,777,361 * 7/1998 Parris et al. .

FOREIGN PATENT DOCUMENTS 8-97304  4/1996 (JP) .

* cited by examiner

Primary Examiner—Stephen D. Meier
(74) Attorney, Agent, or Firm—Scully, Scott, Murphy & Presser

(57) ABSTRACT

A nonvolatile memory includes a first conductive type of semiconductor region and a second conductive type of impurity diffusion layer. The impurity diffusion layer is formed by doping into a predetermined region of the semiconductor region, impurity of the second conductive type that differs from the first conductive type. The impurity diffusion layer is used as a bit line. The impurity diffusion layer has a specific layer in which an impurity density is substantially equal to or higher than $1\times10^{18}$ cm$^{-3}$, and wherein B>A where A is a diffusion length in a lateral direction from the predetermined region and B is a thickness of the specific layer in a depth direction.

13 Claims, 16 Drawing Sheets

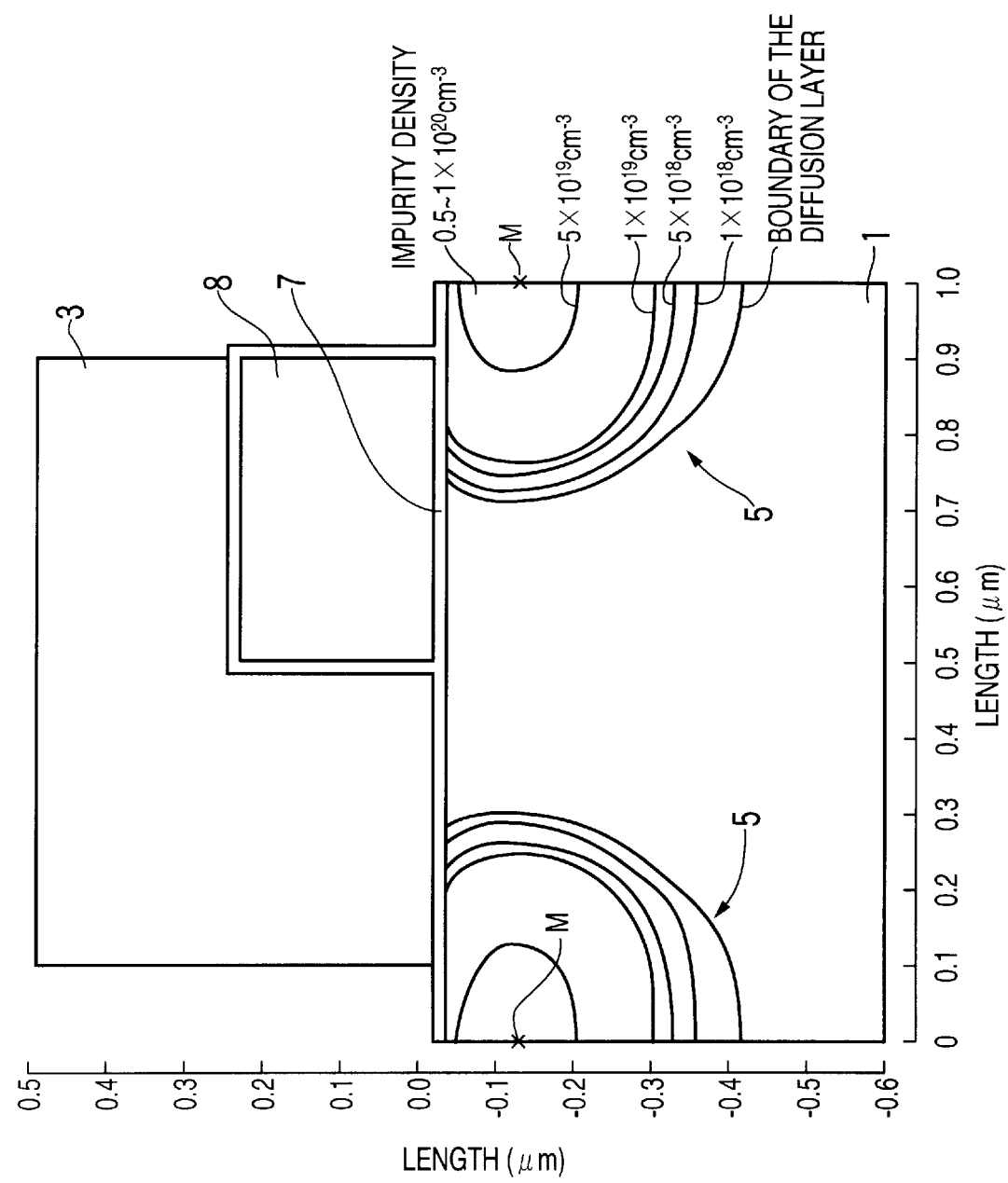

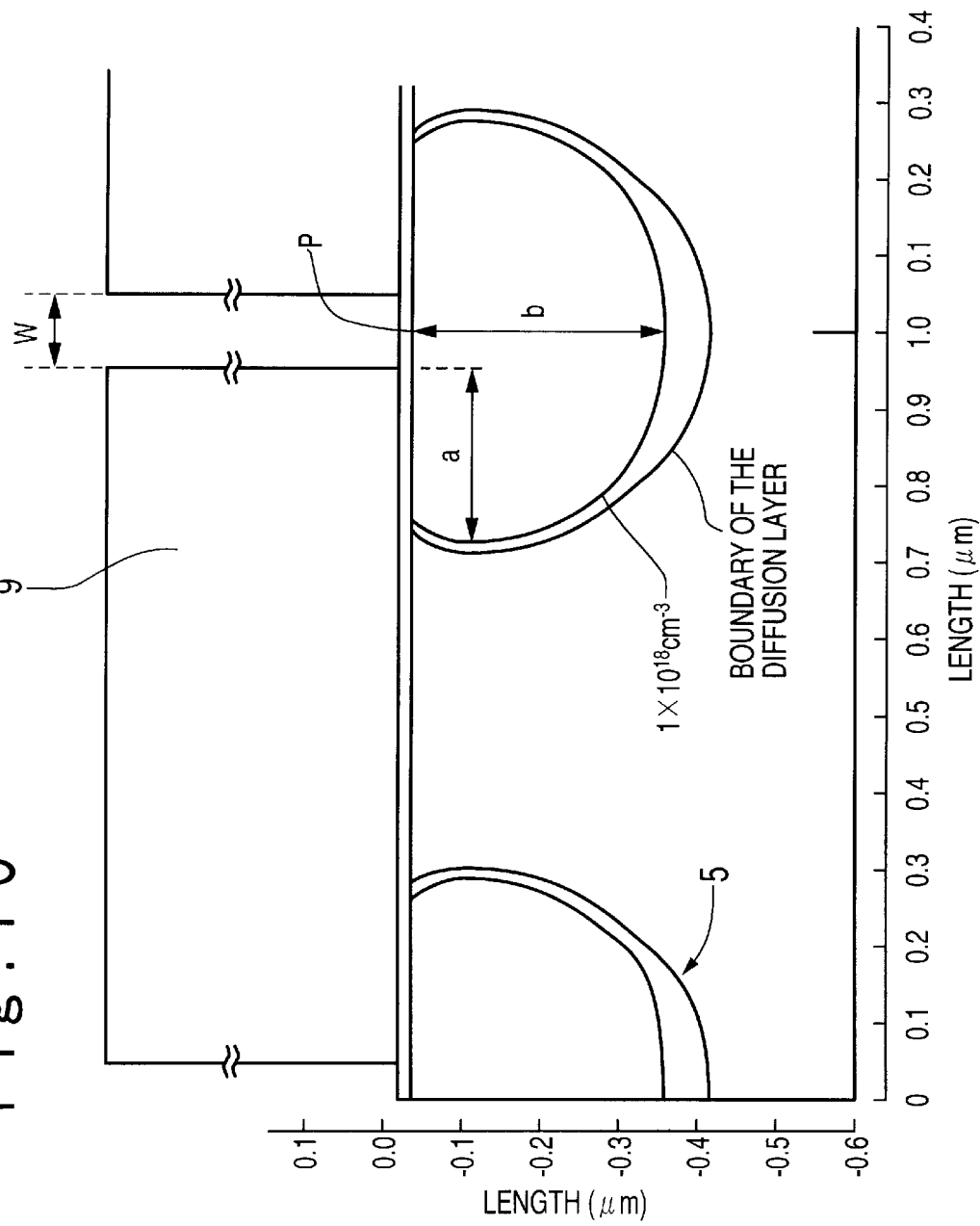

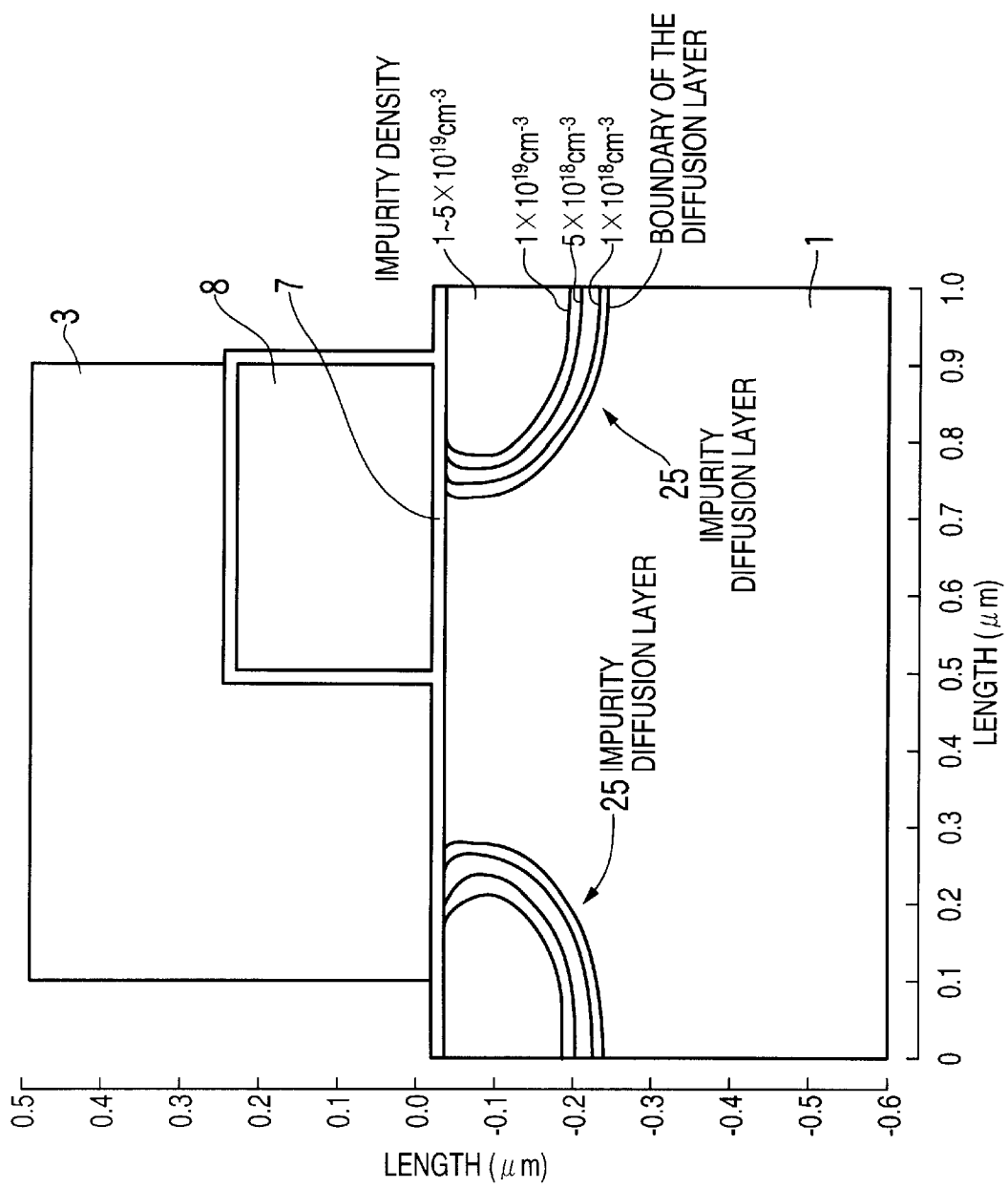

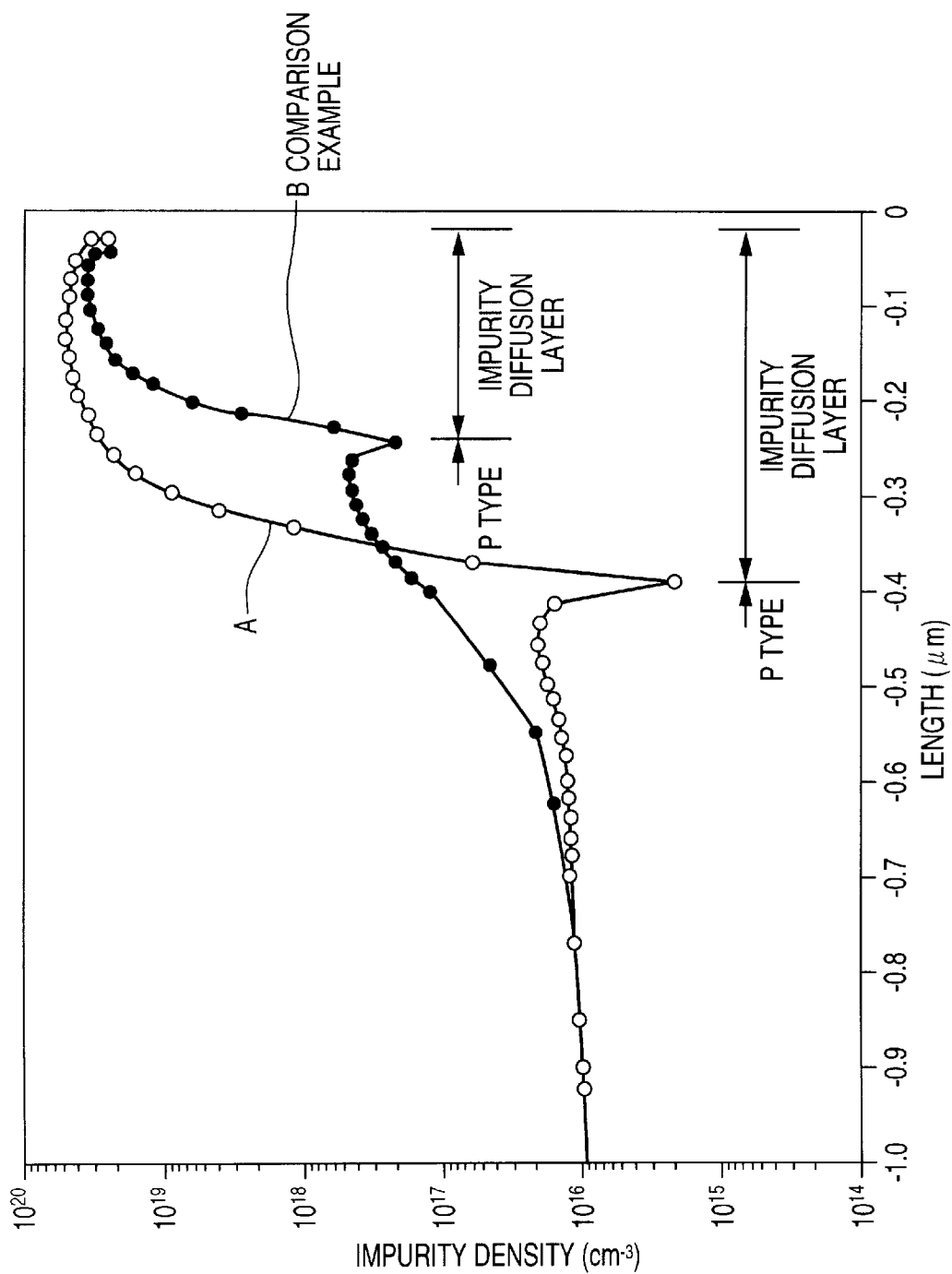

48 IMPURITY DIFFUSION LAYER

NONVOLATILE MEMORY HAVING CONTACTLESS ARRAY STRUCTURE WHICH CAN RESERVE SUFFICIENT ON CURRENT, WITHOUT INCREASING RESISTANCE, EVEN IF WIDTH OF BIT LINE IS REDUCED AND CREATION OF HYPERFINE STRUCTURE IS TRIED, AND METHOD OF MANUFACTURING NONVOLATILE MEMORY

BACKGROUND OF THE INVENTION

1. Field of the Invention

The present invention relates to a nonvolatile semiconductor memory. More particularly, the present invention relates to a nonvolatile memory having a contactless array structure, in which an impurity diffusion layer is used as a bit line, and a method of manufacturing the nonvolatile memory.

2. Description of the Related Art

FIGS. 1 and 2 show a flash memory having a split gate type of contactless array structure described in Japanese Laid Open Patent Application (JP-A-Heisei 8-97304).

As shown in FIG. 1, an n-type impurity diffusion layer 105 constituting a source/drain region, a silicon oxide film 106 formed by oxidizing a surface of a p-type silicon substrate 101, a floating gate 108, a control gate 113 also serving as a split gate, a silicon oxide film 107, a silicon oxide film 112 and an inter-gate insulating film 114 are formed in a p-type silicon substrate 101.

The silicon oxide film 107 is formed between the floating gate 108 and the p-type silicon substrate 101 to serve as a tunneling insulating film. The silicon oxide film 112 constitutes a gate insulating film in a split gate region. The inter-gate insulating film 114 is formed between the control gate 113 and the floating gate 108.

FIG. 1 shows a case in which the three-layer structure of ONO is used as the inter-gate insulating film 114. However, a single layer structure of the silicon oxide film may be used.

As shown in FIG. 2 (FIG. 1 is a section view taken on the line A–A' of FIG. 2), the n-type impurity diffusion layer 105 also serves as a bit line. The control gate 113 also serves as a word line. In this way, the type in which the impurity diffusion layer is used as the bit line is referred to as a contactless array. Since the impurity diffusion layer is used as the bit line in the contactless array structure, the creation of a hyperfine structure is easier than that in a contact array structure which requires a single wiring contact per cell.

Operations of the flash memory shown in FIG. 1 will be described below.

Here, a write state is assumed to be a low threshold voltage state (an electron emission state), and an erase state is assumed to be a high threshold voltage state (an electron injection state).

In the writing operation, for example, –8 V is applied to the control gate 113, 5 V is applied to the drain (the n-type impurity diffusion layer 105 on the right side in FIG. 1), the source (the n-type impurity diffusion layer 105 on the left side in FIG. 1) is opened, and the substrate 101 is grounded. Then, the electrons are drawn from the floating gate 108 to the drain through F-N (Fowler Nordheim) tunneling. This leads to the reduction of a threshold voltage of a memory transistor.

In the erasing operation, a high voltage, for example, 16 V is applied to the control gate 113. Then, the drain 105, the source 105 and the substrate 101 are all grounded. The electrons are drawn from the substrate 101 or the drain 105 to the floating gate 108 through the F-N tunneling.

Under this condition, a film thickness of the silicon oxide film 112 in the split gate region is sufficient, which prevents an F-N tunnel current from flowing to the split gate. Thus, the application of the high voltage to the control gate 113 does not cause the silicon oxide film 112 in the split gate region to be deteriorated.

Also, the reading operation is performed such that 3 to 5 V is applied to the control gate 113. Approximately 1 V is applied to the drain 105. The source 105 and the substrate 101 are grounded. Then the presence or absence of drain current is detected.

As mentioned above, the flash memory shown in FIG. 1 uses the impurity diffusion layer 105 as the bit line. Thus, the creation of the hyperfine structure is easier than that with the contact array structure which requires the single wiring contact per cell.

However, in order to further promote the creation of the hyperfine structure, it is necessary to prevent the diffusion of the impurity of the impurity diffusion layer 105 in a lateral direction, namely, in a gate direction from causing a short channel effect. Therefore it is inevitable to reduce the dose amount of the impurity doped and decrease a temperature at an activating process. As a result, the impurity diffusion layer 105 serving as the bit line becomes narrow in width and becomes shallow in a depth direction. Thus, a resistance of the bit line becomes higher associated with a smaller cross-sectional region. Hence, a current flowing through the bit line becomes smaller. As a result, if trying to provide a sufficient current flow through the cell such that an access speed of the cell is not slow, it is necessary to reduce the number of cells connected to the bit line.

Moreover, if the resistance of the bit line becomes larger as mentioned above, a length of the bit line connected to the single contact is limited, which reduces the number of memory cells connected to the single contact. Accordingly, the number of contacts in the flash memory as a whole is increased, which results in a problem that the creation of the hyperfine structure can not be sufficiently achieved.

The present invention is accomplished in view of the above mentioned problems. Therefore, an object of the present invention is to provide a contactless array type of a nonvolatile memory which can reserve a sufficient ON current, without increasing a resistance, even if a width of a bit line is reduced to create a hyperfine structure. Moreover, according to the present invention, it can be held to a sufficiently small resistance. Thus, many memory cells can be connected to the single contact. Hence, the number of contacts can be reduced. Therefore, it is possible to attain the creation of the further hyperfine structure.

SUMMARY OF THE INVENTION

The present invention has been made to solve the above-described problems of the conventional nonvolatile semiconductor memory. That is, this nonvolatile memory having contactless array structure can reserve sufficient ON current, without increasing resistance, even if width of bit line is reduced and creation of hyperfine structure is tried, and method of manufacturing nonvolatile memory.

In order to achieve an aspect of the present invention, a nonvolatile memory includes a first conductive type of semiconductor region; and a second conductive type of impurity diffusion layer which is formed by doping into a predetermined region of the semiconductor region, impurity of the second conductive type that differs from the first conductive type, the impurity diffusion layer being used as a bit line, wherein the impurity diffusion layer has a specific layer in which an impurity density is substantially equal to or higher than $1\times10^{18}$ cm$^{-3}$, and wherein B>A where A is a diffusion length in a lateral direction from the predetermined region and B is a thickness of the specific layer in a depth direction.

In this case, a thickness of the impurity diffusion layer in a depth direction is larger than half a width of a surface portion of the impurity diffusion layer.

Also in this case, the thickness of the specific layer in the depth direction of the impurity diffusion layer is substantially equal to or higher than 0.25 $\mu$m.

Further in this case, the impurity diffusion layer has, in a predetermined position of the impurity diffusion layer in a depth direction, a maximum impurity density portion in which the impurity density of the impurity diffusion layer is maximum.

In order to achieve another aspect of the present invention, the maximum impurity density portion is substantially provided in a depth of 0.05 $\mu$m or more from a surface portion of the impurity diffusion layer.

In this case, a side close to a surface portion of the impurity diffusion layer is lower in impurity density of the impurity diffusion layer than a side away from the surface portion of the impurity diffusion layer.

Also in this case, in the impurity diffusion layer, a width of the impurity diffusion layer in a depth corresponding to the maximum impurity density portion is larger than a width of the impurity diffusion layer on a surface portion of the impurity diffusion layer.

Further in this case, the second conductive type of impurity is arsenic.

In order to achieve still another aspect of the present invention, a nonvolatile memory includes a first conductive type of semiconductor layer; and a plurality of impurity diffusion layers which are formed on the first conductive type of semiconductor layer to transmit a signal, wherein the first conductive type of semiconductor layer prevents punch through that depletion layers are connected to each other when the signal is transmitted in each of the plurality of impurity diffusion layers.

In this case, a thickness of the impurity diffusion layer in a depth direction is larger than half a width on a surface portion of the impurity diffusion layer.

Also in this case, the impurity diffusion layer has, in a predetermined position of the impurity diffusion layer in a depth direction, a maximum impurity density portion in which the impurity density of the impurity diffusion layer is maximum.

Further in this case, a side close to a surface portion of the impurity diffusion layer is lower in impurity density of the impurity diffusion layer than a side away from the surface portion of the impurity diffusion layer.

In order to achieve yet still another aspect of the present invention, in the impurity diffusion layer, a width of the impurity diffusion layer in a depth corresponding to the maximum impurity density portion is larger than a width of the impurity diffusion layer on a surface portion of the impurity diffusion layer.

In order to achieve another aspect of the present invention, a method of manufacturing a nonvolatile memory includes providing a predetermined region for forming a bit line in a first conductive type of semiconductor region; forming a mask having an opening portion in the predetermined region on the semiconductor region; performing a first ion implantation in the predetermined region of the semiconductor region through the opening portion of the mask, with a first acceleration energy, using first impurity of a second conductive type that differs from the first conductive type; performing a second ion implantation in the predetermined region of the semiconductor region through the opening portion of the mask, with a second acceleration energy lower than the first acceleration energy, using second impurity of the second conductive type; and forming an impurity diffusion layer by heating the first and second impurities to form the bit line.

In this case, the first acceleration energy is 100 to 300 keV, and the second acceleration energy is 20 to 80 keV.

Also in this case, a dose amount of the first impurity is larger than a dose amount of the second impurity.

Further in this case, a width of the opening portion of the mask is substantially equal to or less than 0.4 $\mu$m.

In this case, the first and second impurities are identical to each other in kind.

Also in this case, the first and second impurities may be different from each other in kind.

Further in this case, the first ion implantation is performed before the second ion implantation.

In this case, the second ion implantation may be performed before the first ion implantation.

Also in this case, the first and second impurities are arsenic.

In order to achieve still another aspect of the present invention, a method of manufacturing a nonvolatile memory further includes forming an impurity layer of the first conductive type in the semiconductor region, the impurity layer being higher in density than the semiconductor region; wherein the first ion implantation is performed to set a maximum impurity density position at an inner portion of the impurity layer.

In this case, the first conductive type of impurity layer functions as a punch through stopper which suppresses an occurrence of a punch through that depletion layers are connected to each other when each of a plurality of the impurity diffusion layers operates.

Also in this case, the forming the impurity diffusion layer includes annealing the first and second impurities at a temperature between 800 and 950° C.

BRIEF DESCRIPTION OF THE DRAWINGS

A more complete understanding of the teachings of the present invention may be acquired by referring to the accompanying figures, in which like reference numbers indicate like features and wherein:

FIG. 9 is a view showing the profile of an impurity density of an impurity diffusion layer of the flash memory in the first embodiment;

FIG. 10 is a view showing a mask position and a shape of the impurity diffusion layer of the flash memory in the first embodiment;

FIG. 11 is a view showing the profile of an impurity density of an impurity diffusion layer of a flash memory in a comparison example in the first embodiment;

FIG. 12 is a graph showing the profile of impurity densities at centers of the impurity diffusion layers in the flash memories in the first embodiment (a curve A) and the comparison example (a curve B);

DESCRIPTION OF THE PREFERRED EMBODIMENTS

Referring now to drawings, various preferred embodiments according to the present invention will be described in detail.

Figure 1:
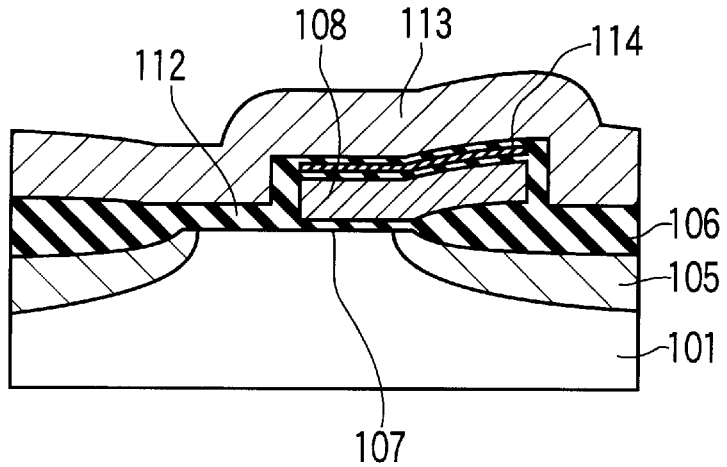
FIG. 1 is a section view of an example of a conventional flash memory.
Figure 2:
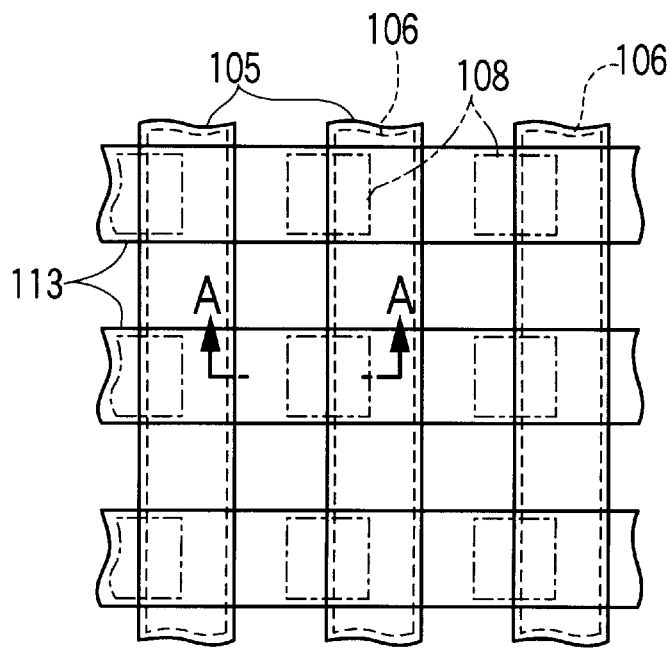
FIG. 2 is a plan view of an example of a conventional flash memory.
Figure 3:
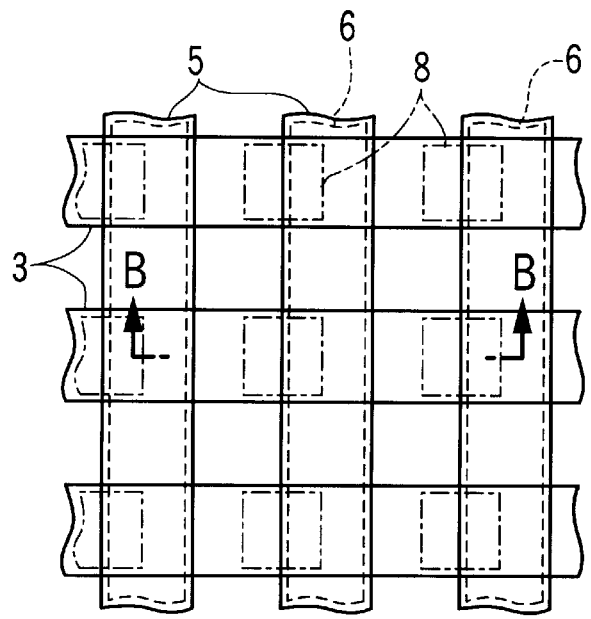
FIG. 3 is a plan view showing a first embodiment of a flash memory according to the present invention.
Figure 4:
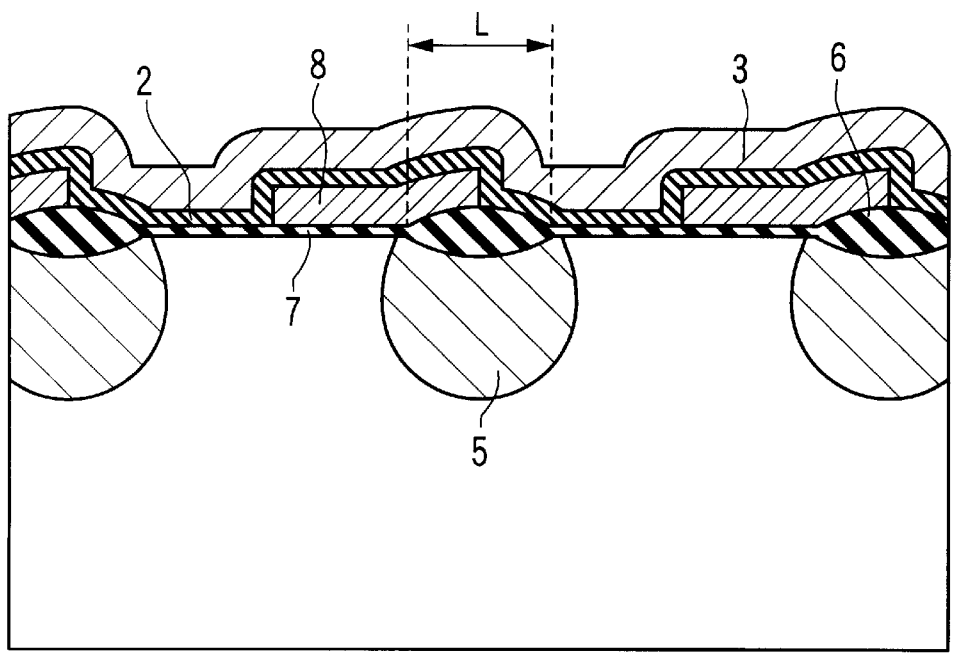
FIG. 4 is a section view showing the first embodiment of the flash memory in the present invention.

FIGS. 3 and 4 show an example of a flash memory as one embodiment of a nonvolatile memory according to the present invention. As shown in FIG. 3, a control gate 3 also serves as a word line, and an n-type impurity diffusion layer 5 is a contactless array type and also serves as a bit line.

As shown in FIG. 4 (a section view taken on the line B—B of FIG. 3), the n-type impurity diffusion layer 5 constituting a source/drain region, a silicon oxide film 6 formed by oxidizing a surface of a silicon substrate, a floating gate 8, the control gate 3 serving as a split gate, a silicon oxide film 7 which is formed between the floating gate 8 and the substrate 1 and also serves as a tunneling insulating film, and a silicon oxide film 2 constituting a gate insulating film in a split gate region are formed in a p-type silicon substrate 1.

The silicon oxide film 2 of a single layer is formed between the control gate 3 and the floating gate 8. However, instead of the silicon oxide film 2 of the single layer, a three-layer structure of ONO may be used similarly to that disclosed in Japanese Laid Open Patent Application (JP-A-Heisei 8-97304).

Figure 5:
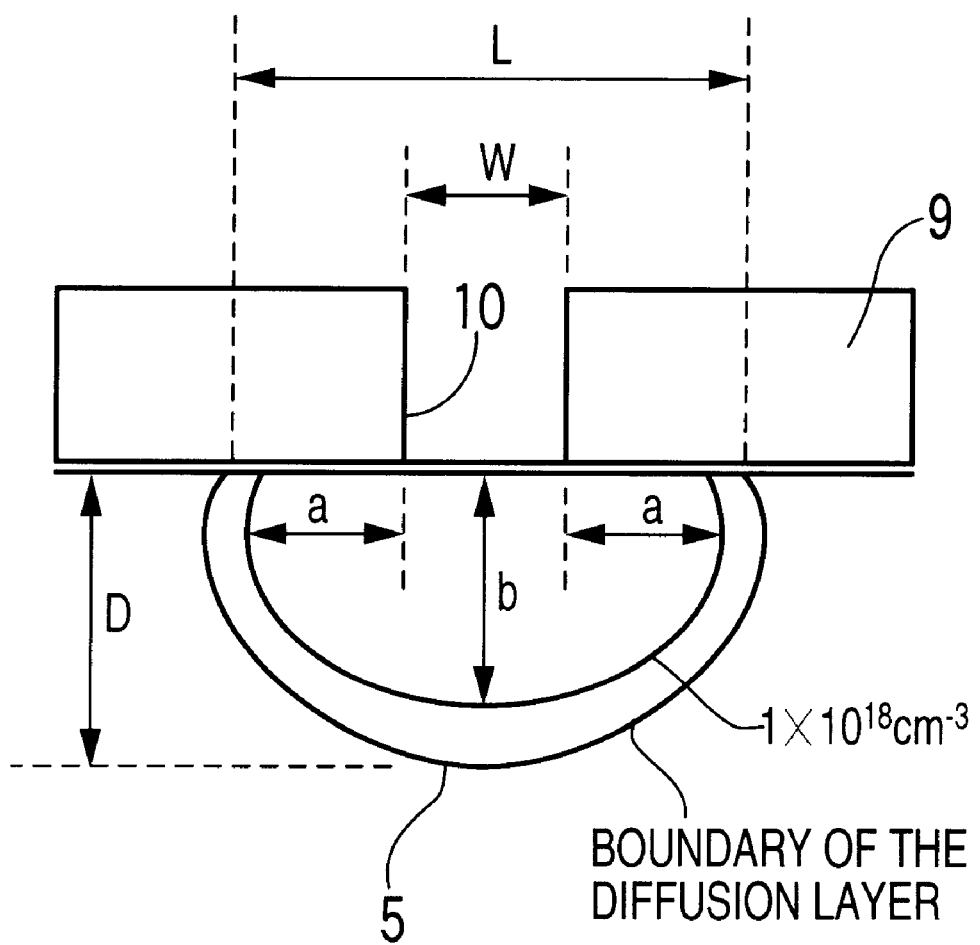
FIG. 5 is a section view showing a mask position and a shape of an impurity diffusion layer in the flash memory according to the present invention.

FIG. 5 is an enlarged diagrammatic view of the impurity diffusion layer 5, and shows a boundary of the diffusion layer, an iso-density line (isoconcentration line) at an impurity density of $1 \times 1^{18}$ cm$^{-3}$, and a mask 9 used when ion implantation of arsenic is performed in a process of manufacturing this flash memory. The ion implantation is performed through an opening (an opening width of W) of the mask 9 into the substrate. After that, the ion-implanted impurities are diffused in a depth direction and in a lateral direction by thermal annealing.

A depletion layer is not substantially spread to a region having the impurity density equal to or higher than $1 \times 1^{18}$ cm$^{-3}$. Hence, it can be considered that the region having the impurity density equal to or higher than $1 \times 1^{18}$ cm$^{-3}$ corresponds to an effective bit line. Then, when the shape of the region having the impurity density equal to or higher than $1 \times 1^{18}$ cm$^{-3}$ is noted, a thickness b in a depth direction in the region having the impurity density equal to or higher than $1 \times 1^{18}$ cm$^{-3}$ is larger than a diffusion length a in a lateral direction from a mask boundary 10.

That is, the thickness b of the effective bit line in the depth direction is larger than the length a of the diffusion expansion of the effective bit line in the lateral direction. Hence, even if the width of the impurity diffusion layer on the surface of the substrate is made hyperfine, a sufficient small resistance can be attained. Moreover, $b \geq 1.3a$ is desirable. And, $b \geq 1.5a$ is further desirable.

Moreover it is desirable that the impurity diffusion layer 5 constituting the bit line has the shape that a thickness D up to the deepest portion of the impurity diffusion layer 5 in the depth direction is larger than half a width L on a surface of the impurity diffusion layer 5 of the impurity diffusion layer 5. Thus, even if the width on the surface of the impurity diffusion layer 5 is made hyperfine, the resistance can be held to a small value because of the large dimension in the depth direction of the impurity diffusion layer 5. Furthermore, it is desirable that the thickness D of the impurity diffusion layer 5 in the depth direction is larger than ⅔ the width L of the impurity diffusion layer 5 in the upper portion of the impurity diffusion layer 5.

Due to the above-mentioned structure, even if the present invention is applied to the flash memory in which the width in the upper portion of the impurity diffusion layer is reduced down to 0.1 to 0.4 μm, especially, even if it is applied to the flash memory in which the width is reduced down to approximately 0.24 μm or less, both the element characteristic and the resistance of the bit line can be satisfied at the same time.

In the present invention, it is very desirable that the impurity density in the impurity diffusion layer is set to be low in the surface portion of the substrate and high in the deep portion of the substrate. That is, the impurity diffusion layer is formed such that the impurities of the impurity diffusion layer are not spread in the gate direction. Thus, the impurities in the shallow portion of the impurity diffusion layer contributing to the operation of the flash memory are maintained in the relatively low density. Hence, this does not lead to the trouble, such as the short channel effect and the like. Moreover, a necessary conductivity can be reserved by making the impurity density higher in the deep portion of the impurity diffusion layer which does not contribute to the operation of the flash memory.

In the present invention, it is desirable that the maximum impurity (such as arsenic) density portion of the impurity diffusion layer exists in a predetermined position in the depth direction. When looking at the impurity density profile of the bit line in the depth direction, at a center of the bit line in the width direction, the impurity density in the upper portion of the impurity diffusion layer is $1\times10^{18}$ to $1\times10^{19}$ $cm^{-3}$. The impurity density becomes higher with depth up to the maximum arsenic density portion.

The impurity density at the maximum arsenic density portion is $1\times10^{19}$ to $1\times10^{21}$ $cm^{-3}$. Preferably, it is $5\times10^{19}$ to $1\times10^{21}$ $cm^{-3}$. Preferably, the maximum arsenic density portion is formed at a depth of at least 0.05 μm or more from the surface side of the impurity diffusion layer. Typically, it is desirable to be formed at a portion of 0.4 μm or less (preferably, 0.3 μm or less) from the surface side of the impurity diffusion layer.

Moreover, it is desirable that the thickness of the region corresponding to the impurity density of $1\times10^{18}$ $cm^{-3}$ or more in the depth direction is 0.25 μm or more.

The contactless array type flash memory to which the present invention is applied can be applied to all the flash memories in which a plurality of cells are connected to each flash memory with the impurity diffusion layer as the bit line, unless the contactless array requires a single wiring contact per cell. Thus, the application of the present invention to even a structure, in which a wiring contact is mounted with a plurality of cells as a unit, enables a resistance of the structure to be lower and also enables the creation of the further hyperfine structure.

Even if the flash memory is not the split gate type as shown in FIG. 4, the present invention can be applied to another type flash memory, if it is a contactless array type using the impurity diffusion layer as the bit line.

In the present invention, the p-type silicon substrate can be used as the semiconductor substrate. However, this also includes the case in which the flash memory is formed in a p-type well formed on the p-type or n-type silicon substrate.

The application of the present invention is not limited to the flash memory. If the impurity diffusion layer is used as the bit line, the present invention can be also applied to a nonvolatile memory, such as EEPROM and the like, other than a mask ROM, an ultraviolet erase type EPROM and the flash memory.

The present invention will be described further actually below with reference to the drawings.
[Embodiment 1]

An embodiment in the present invention will be described with reference to FIGS. 6A to 8B while illustrating a manufacturing method. FIGS. 6A to 8B correspond to the section view taken on the line B—B of FIG. 3.

Figure 6A:
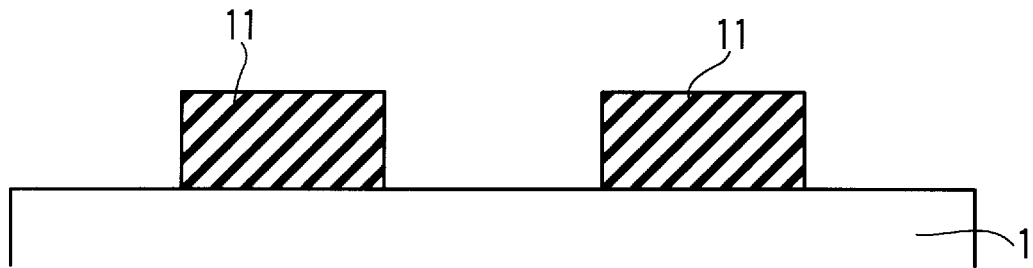
FIG. 6A is a section view showing one process of manufacturing the flash memory of the first embodiment.

At first, for example, an element separation region (not shown) is formed on a surface of a p-type silicon substrate 1. After that, as shown in FIG. 6A, a silicon oxide film is grown to have a film thickness of, for example, 300 nm by using a CVD (Chemical Vapor Deposition) method. Then, a silicon oxide film 11 is formed by the application of a photolithography method and a dry etching method such that a pattern of the silicon oxide film 11 remains on a channel region in the silicon substrate 1.

Figure 6B:
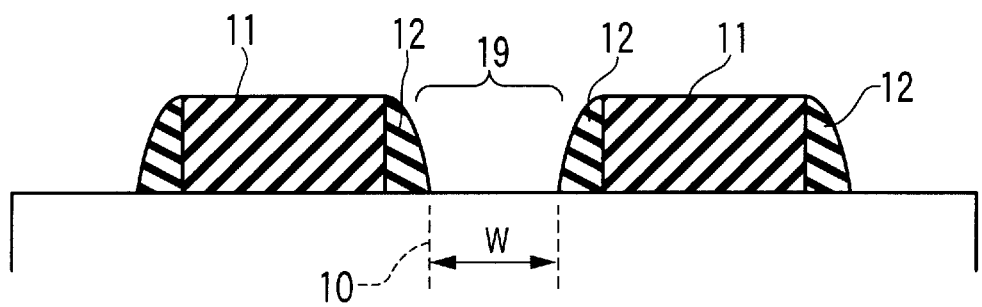
FIG. 6B is a section view showing another process of manufacturing the flash memory of the first embodiment.

After the silicon oxide film 11 is formed by using the CVD method, an etch-back operation is performed to form a side wall oxide film 12 as shown in FIG. 6B. Here, the silicon oxide film 11 and the side wall oxide film 12 function as the mask when the arsenic is ion-implanted. Then, the arsenic is ion-implanted through a opening (an opening width W) of the mask in an implantation region 19.

The width W of the opening is properly predetermined, depending on a degree of the hyperfineness of the bit line, by considering the diffusion of the arsenic in the lateral direction when the thermal annealing is performed. In this case, the mask opening boundary 10 to determine a value of the opening width W is located at a position where the side wall oxide film 12 is in contact with the surface of the substrate 1. Since the present invention is applied to the hyperfine device, the opening width W is typically equal to or less than 0.4 μm. For example, it is set to 0.1 to 0.2 μm.

The side wall oxide film 12 is provided to form a thinner line than a limit of a lithography in which a photo-resist is used. The side wall oxide film 12 is not required if space between the silicon oxide films 11 to form the bit line can be formed in the sufficiently thin condition without the side wall oxide film 12.

The silicon oxide film 11 and the side wall oxide film 12 may be formed of other materials, if they can function as the mask when the arsenic is ion-implanted. So, silicon nitride film, polysilicon and the like may be used. Moreover, if the side wall oxide film is not formed, the photo-resist may be used as it is, instead of the silicon oxide film 11.

Figure 6C:
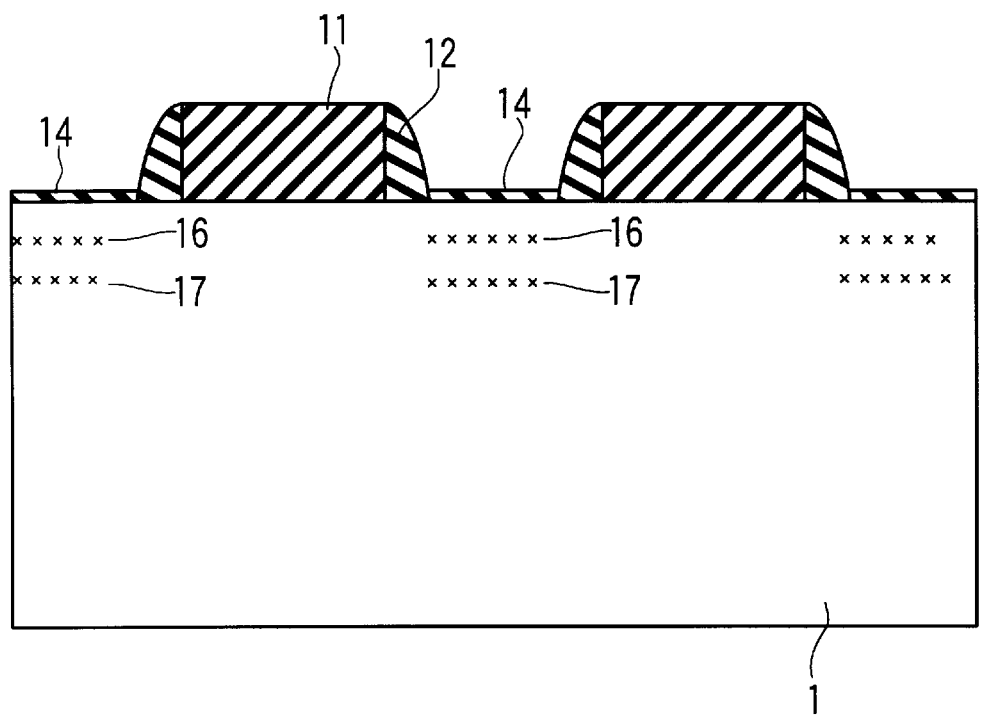
FIG. 6C is a section view showing still another process of manufacturing the flash memory of the first embodiment.

As shown in FIG. 6C, a silicon oxide film 14 is formed on the surface of the substrate 1 by using a thermally oxidizing method, for the sake of contamination protection. After that, with the silicon oxide film 11 and the side wall oxide film 12 as the mask, the ion implantation of the arsenic is performed under conditions of an acceleration energy of 40 keV and a dose amount of $5\times10^{14}$ $cm^{-2}$. Again, the ion implantation of the arsenic is performed under conditions of an acceleration energy of 200 keV and a dose amount of $2\times10^{15}$ $cm^{-2}$. Then, peak positions of the implanted ions in the density are separated in accordance with the acceleration energy, so that they are separated into ions 16 implanted in a shallow region of the substrate 1 and ions 17 implanted in a deep region of the substrate 1, as shown in FIG. 6C.

Here, in the process of ion-implanting the arsenic under a low acceleration energy, it is desirable to properly select the acceleration energy in a range between 20 and 80 keV, especially in a range between 30 and 50 keV, by considering the thickness of the silicon oxide film 14 so that the peak of the ion-implanted arsenic in the density is located at a depth of approximately 200 angstroms from the surface of the substrate 1. Typically, the dose amount of the arsenic ranges between $1 \times 10^{14}$ and $1 \times 10^{16}$ cm$^{-2}$. Preferably, it is properly selected in a range in which the excessive diffusion of the arsenic does not cause the short channel effect, when activation is performed in a later thermal annealing process.

In the process of ion-implanting the arsenic with the high acceleration energy, it is desirable to properly select the acceleration energy in a range between 100 and 300 keV, especially in a range between 150 and 250 keV so that the peak of the ion-implanted arsenic in the density is located at a depth between approximately 400 and 500 angstroms from the surface of the substrate 1. In this case, the dose amount of the arsenic is typically in a range between $1 \times 10^{14}$ and $1 \times 10^{16}$ cm$^{-2}$. It is desirable that the dose amount of the arsenic is greater than that in the ion-implanting process with the above-mentioned low acceleration energy. The deeply-implanted impurities have no influence on the movement of carriers in the channel under the gate, even if the impurities are somewhat diffused in the lateral direction, since they are activated and diffused in the later thermal annealing process. Thus, there is no problem in the operation of the element.

The time of the ion-implantations of the arsenic may be three or more unless the density of the arsenic is excessive in the shallow portion of the substrate affected by at least the element operation. Especially, if the performance of the ion-implantation with the high acceleration energy is divided into a plurality of times to change the acceleration energy accordingly at each time and then the arsenic is ion-implanted, it is easy to form the high density region in a long range in the depth direction. Moreover, the ion-implantation with the high acceleration energy and the ion-implantation with the low acceleration energy may be performed in any order.

Figure 7A:
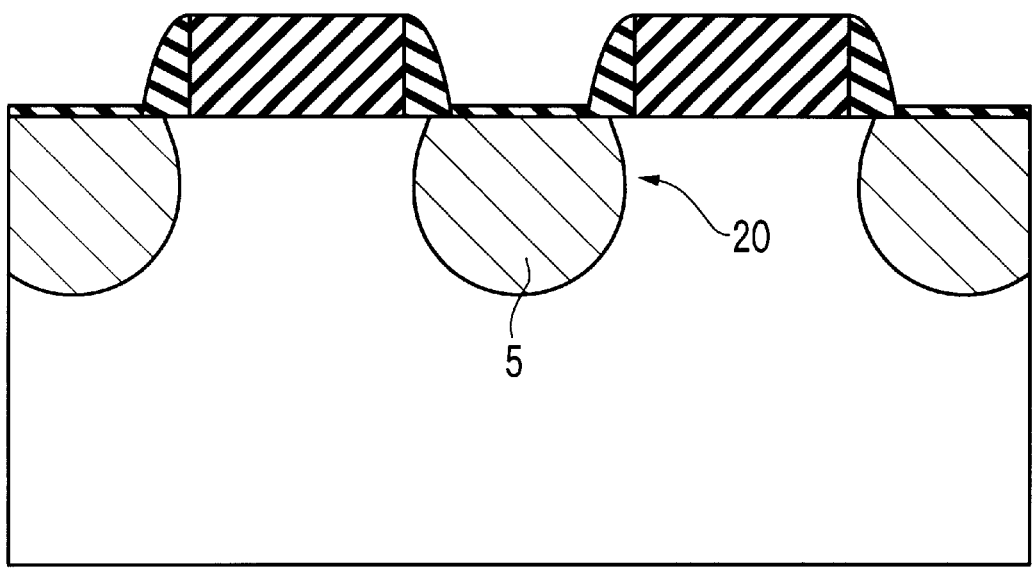
FIG. 7A is a section view showing still another process of manufacturing the flash memory of the first embodiment, following FIG. 6C.

As shown in FIG. 7A, when the annealing is performed in N$_2$ atmosphere, for example, at a temperature of 900° C. and for 20 minutes, the ion-implanted arsenic is diffused and activated, which leads to the formation of the n-type impurity diffusion layer 5 serving as the source/drain region. As a result, the n-type impurity diffusion layer 5 serving as the bit line can be formed such that the width in the deep portion of the n-type impurity diffusion layer 5 is larger than the width in the upper portion of the n-type impurity diffusion layer 5.

The shape of the impurity diffusion layer 5 depends on the dose amount and the implantation energy at the time of each implantation. If the dose amount when the arsenic is implanted with the high energy is larger than the dose amount when the arsenic is implanted with the low energy, it is formed to have the maximum width larger than the width of the upper portion of the impurity diffusion layer in a position deeper than the upper portion of the impurity diffusion layer. The portion corresponding to the maximum arsenic density exists in the center in the width direction of the impurity diffusion layer 5, in the widest position of the impurity diffusion layer 5 illustrated by a symbol 20.

Incidentally, the annealing temperature is in a range between 800 and 950° C., preferably between 800 and 850° C. It is desirable to use the temperature on the lower temperature side in the above-mentioned range, as the degree of the hyperfineness is higher.

Figure 7B:
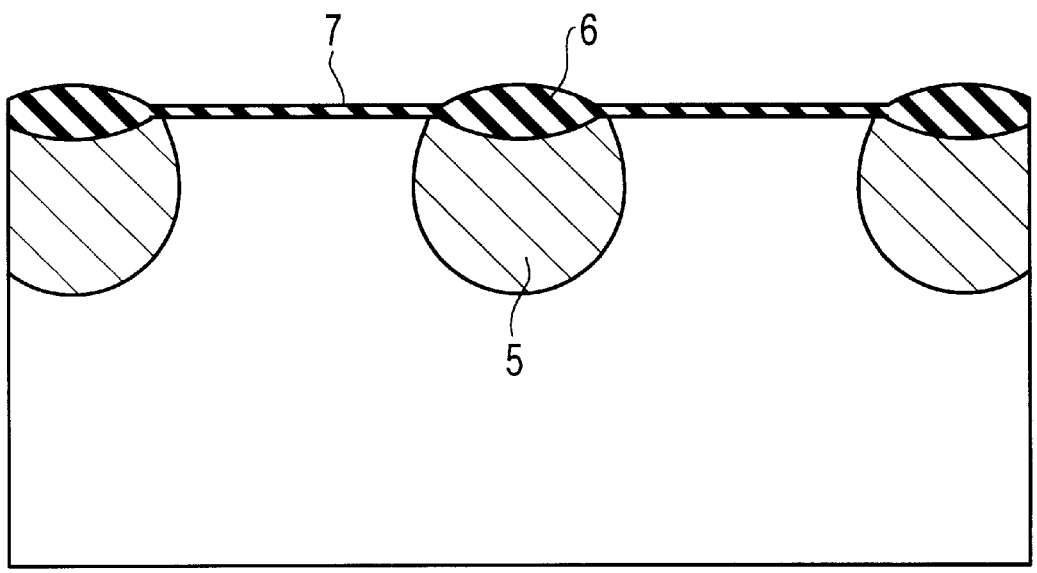
FIG. 7B is a section view showing still another process of manufacturing the flash memory of the first embodiment.

Next, a silicon oxide film 6 having a thickness of approximately 100 nm is formed on the n-type impurity diffusion layer 5 by thermally oxidizing the silicon substrate 1 with the silicon oxide film 11 and the side wall oxide film 12 as the mask. After that, the silicon oxide film 11 and the side wall oxide film 12 are removed by wet-etching to expose the surface corresponding to the channel region of the silicon substrate 1. By continuous using the thermally oxidizing method, a silicon oxide film 7 is formed to have a film thickness of, for example, 8 nm, as a tunnel oxidation film. Then, the structure until FIG. 7B is completed.

The tunnel oxidation film may be formed by using an RTO (Rapid Thermal Oxidation) method, instead of the typical thermal oxidation method. Moreover, in order to improve the reliability of the tunnel oxidation film, the oxidation may be performed by using the RTO method in atmosphere containing N$_2$O or NH$_3$, in addition to oxygen, to then form a silicon nitride oxidation film.

Figure 8A:
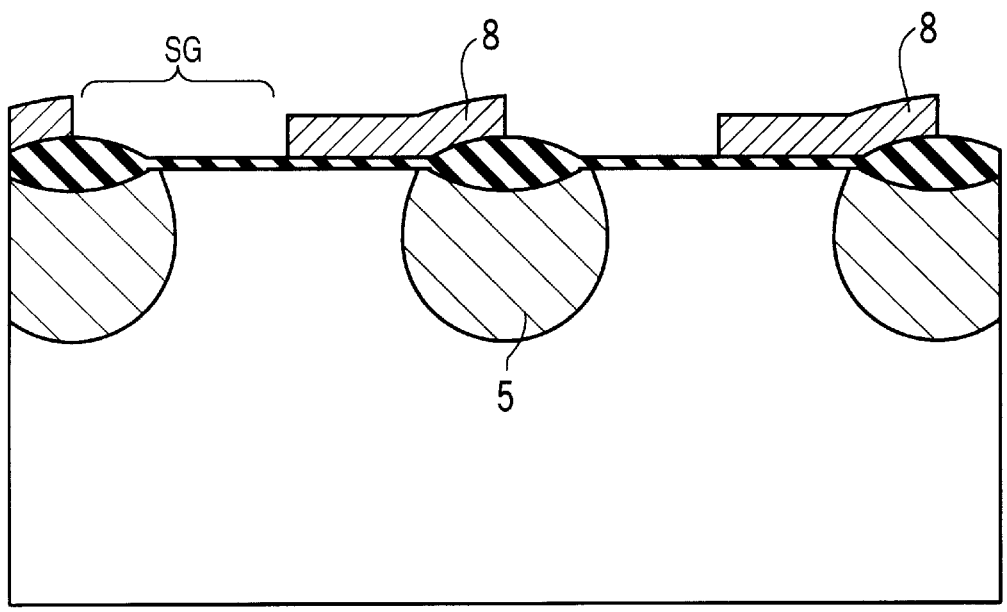
FIG. 8A is a section view showing still another process of manufacturing the flash memory of the first embodiment, following FIG. 7B.

Continuously, as shown in FIG. 8A, a polysilicon film is grown to have 150 nm by the CVD method. The polysilicon film is patterned by using the photolithography method and an RIE (Reactive Ion Etching) method such that a floating gate 8 is formed between the center of the channel region and the side of the drain region 5. Accordingly, a split gate region is formed between the center of the channel region and the source region 5.

Figure 8B:
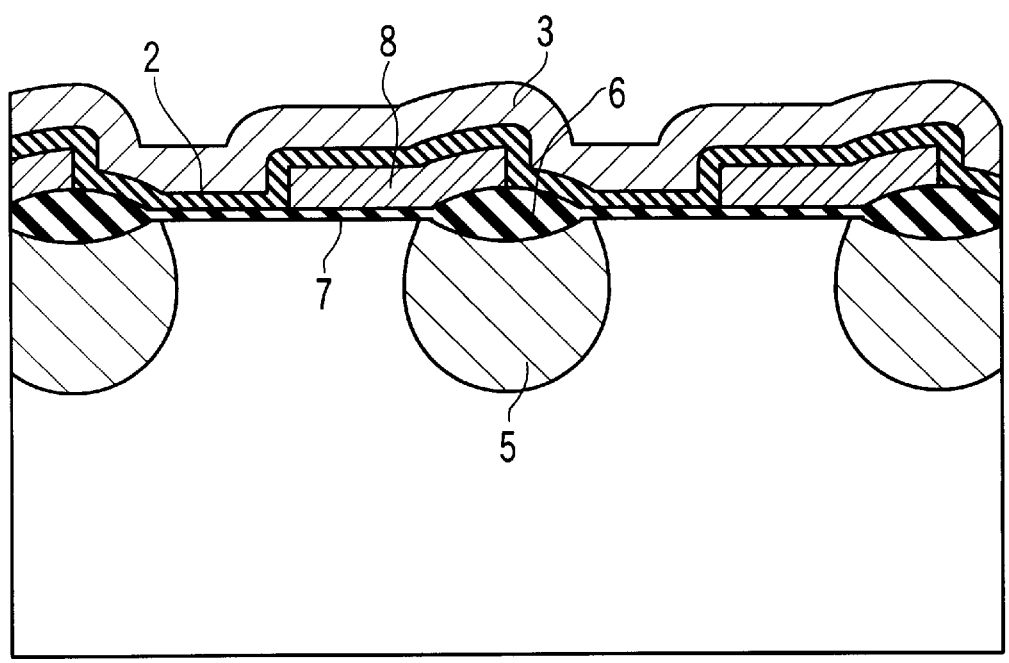
FIG. 8B is a section view showing still another process of manufacturing the flash memory of the first embodiment.

Next, as shown in FIG. 8B, the thermal oxidation is performed so that the silicon oxide film 2 is grown to have a film thickness of 30 nm on a side wall of the polysilicon film 8 and the split gate region. Next, the polysilicon is grown to have a film thickness of 250 nm by the CVD method. Then, the photolithography method and the RIE method are used to form the control gate 3. The control gate 3 may be formed by a polyside film, instead of the polysilicon.

In FIG. 9, shows the shape of the impurity (arsenic) diffusion layer and the profile of the impurity density, investigated by simulation. FIG. 9 shows a section of a single memory cell, as a unit from the center of the bit line in the width direction to a center of a next bit line in the width direction. The elements having no relation to the simulation are omitted. A width of the impurity diffusion layer 5 in the upper portion of the impurity diffusion layer 5 is approximately 0.28 μm on one side of the impurity diffusion layer 5. The depth of the impurity diffusion layer 5 is approximately 0.42 μm. Then, the portion indicating the maximum arsenic density appears in a depth of 0.12 μm as illustrated by a symbol M.

FIG. 10 shows a position of the mask 9 at the time of the ion implantation. The opening portion of the mask 9 has a width W of 0.1 μm, with the center of the opening portion corresponding to a center P of the bit line 5 in the width direction. A thickness illustrated by a symbol "b" of the impurity diffusion layer 5 in the depth direction in which the impurity density is equal to or higher than $1 \times 10^{18}$ cm$^{-3}$ is approximately 0.35 μm. A diffusion length illustrated by a symbol "a" of the impurity diffusion layer 5 from the mask opening boundary 10 in the lateral direction is approximately 0.23 μm.

FIG. 11 shows a comparison example. FIG. 11 shows a density profile and a shape of an impurity diffusion layer 25 as the result of the simulation when the arsenic is implanted under conditions of an acceleration energy of 40 keV and dose amount of $5 \times 10^{15}$ cm$^{-2}$ and then the annealing is performed at the temperature of 900° C. for 20 minutes, similarly to this embodiment. A width of the impurity diffusion layer 25 in the upper portion of the impurity diffusion layer 25 is approximately 0.28 µm on one side of the impurity diffusion layer 25. In contrast to that of FIGS. 9 and 10, the depth of the impurity diffusion layer 25 is approximately 0.26 µm. In addition, the position of the mask is set, similarly to that of FIG. 10.

FIG. 12 shows the profiles of the impurity densities at the centers of the bit lines 5, 25 in the width directions, with regard to FIGS. 9 and 11. A curve "A" in FIG. 12 indicates the profile of the impurity density of the impurity diffusion layer 5 in this embodiment corresponding to FIG. 9. A curve "B" indicates the profile of the impurity density of the impurity diffusion layer 25 in the comparison example corresponding to FIG. 11.

In this way, the flash memory in this embodiment has the large impurity diffusion layer in the depth direction. Although the total of dose amounts is rather small, as shown in the curve A, the impurity diffusion portion indicating the high density equal to or higher than $5 \times 10^{19}$ cm$^{-3}$ appears at the portion of the depth between 0.06 and 0.2 µm, and the impurity diffusion portion indicating the high density equal to or higher than $1 \times 10^{19}$ cm$^{-3}$ exists up to the depth of 0.3 µm. On the contrary, the impurity diffusion portion indicating the high density equal to or higher than $5 \times 10^{19}$ cm$^{-3}$ does not occur in the comparison example, as shown in the curve B, and the impurity diffusion portion indicating the high density equal to or higher than $1 \times 10^{19}$ cm$^{-3}$ is confined to a depth of approximately 0.18 µm.

In this embodiment, as can be understood from the fact that the width of the diffusion layer on the surface of the substrate is equal to that of the comparison example, the diffusion in the lateral direction is small in the vicinity of the surface contributing to the operations of the elements. Thus, the trouble, such as the short channel effect and the like, is never brought about.

As mentioned above, according to the present invention, the flash memory having the impurity diffusion layer used as the bit line with the low resistance can be achieved without having influence on the operations of the elements.

[Embodiment 2]

Figure 13:
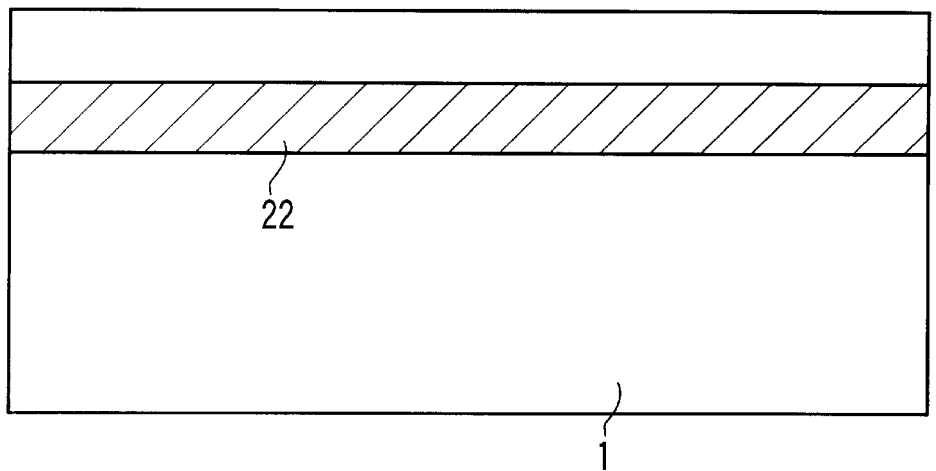
FIG. 13 is a section view showing one process of manufacturing a second embodiment of the flash memory in the present invention.
Figure 14:
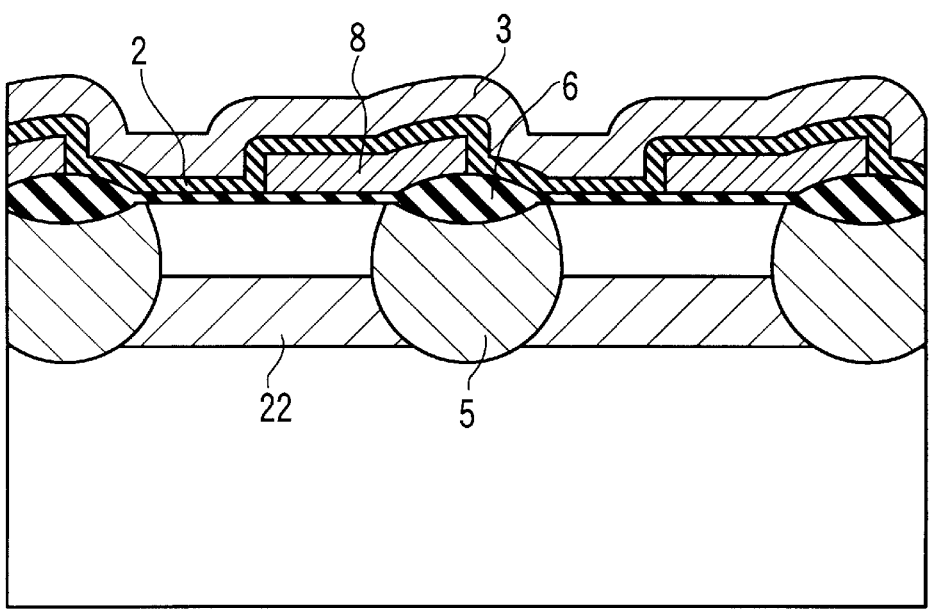
FIG. 14 is a section view showing the second embodiment of the flash memory in the present invention.

As shown in FIG. 13, a p-type impurity layer 22 with the high density is formed in a p-type silicon substrate 1 by the ion implantation. The high p-type impurity layer 22 is formed such that a boron density in a depth range between 0.2 and 0.4 µm in the p-type silicon substrate 1 is higher than those of the other portions in the p-type silicon substrate 1 to have the boron density between approximately $5 \times 10^{16}$ and $5 \times 10^{17}$ cm$^{-3}$. After that, a flash memory shown in FIG. 14 is formed similarly to the embodiment 1 shown in FIGS. 6A to 8B.

In the present invention, the width of the impurity diffusion layer in the lateral direction is large in the deep region of the substrate, especially if the dose amount of the arsenic is large when the ion implantation of the arsenic is performed with the high acceleration energy. As a result, depletion layers is spread when the flash memory operates and thereby the punch through phenomenon, that the depletion layers corresponding to the impurity diffusion layers of the drain and the source are connected to each other, is easily brought about. From this standpoint, if the high p-type impurity layer 22, as in the second embodiment, is formed, it functions as a punch through stopper. Hence, it is possible to make the dose amount further larger, when the ion implantation of the arsenic is performed with the high acceleration energy.

[Embodiment 3]

An embodiment applied to a self-aligning type flash memory will be described below with reference to FIGS. 15A to 18B.

Figure 15A:
FIG. 15A is a section view showing one process of manufacturing a third embodiment of the flash memory in the present invention.

At first, as shown in FIG. 15A, activation regions (channel, drain and source regions) and an element separation region 32 are formed in a p-type silicon substrate 31 by a usual selective oxidization method.

Figure 15B:
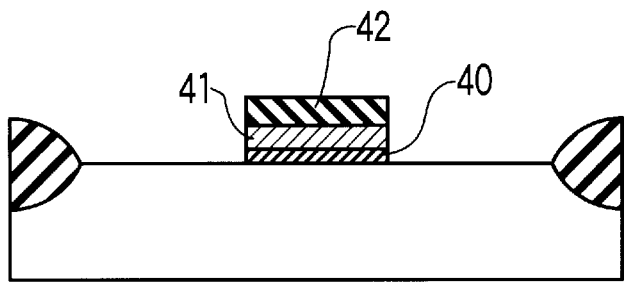
FIG. 15B is a section view showing another process of manufacturing the third embodiment of the flash memory in the present invention.

Continuously as shown in FIG. 15B, a gate insulating film 40 is formed by, for example, the thermally oxidizing method. It is necessary that a thickness of the thermally oxidized film 40 is thicker than that of an oxidation film of a tunnel region, to make a capacity coupling ratio higher.

Then, a polysilicon layer 41 of, for example, 200 nm is formed on the gate insulating film 40 by using the CVD method, and a layer 42 composed of an oxidation film layer of for example, 20 nm and a nitride film layer for example, 100 nm is formed on the pilysilicon layer 41. Then, a floating gate electrode is formed by the patterning of the gate insulating film, the polysilicon layer 41 and the layer 42.

Figure 15C:
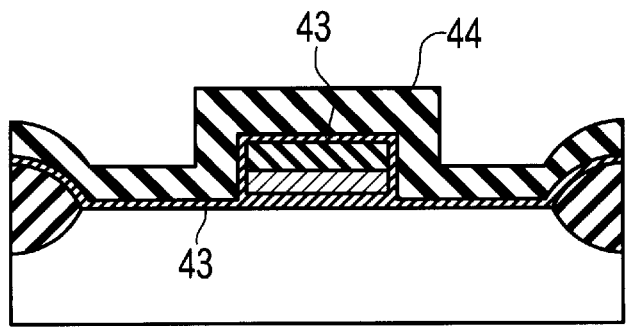
FIG. 15C is a section view showing still another process of manufacturing the third embodiment of the flash memory in the present invention.
Figure 15D:
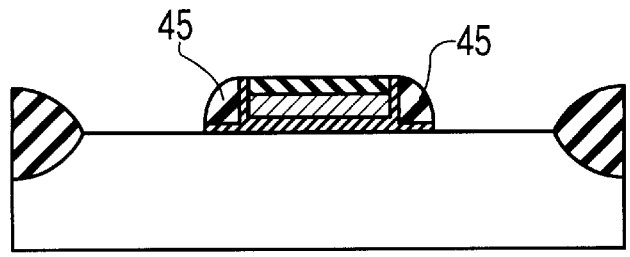
FIG. 15D is a section view showing still another process of manufacturing the third embodiment of the flash memory in the present invention.

Next, as shown in FIG. 15C, an oxidation film 43 of approximately 20 nm and a nitride film 44 of approximately 80 nm are formed on the entire surface of the substrate by using the CVD method. Then, a nitride film side wall 45 is formed by performing the etch-back on the nitride film 44 by using anisotropy etching, as shown in FIG. 15D. At this time, the oxidation film of approximately 20 nm in the layer 42 functions as a substrate protection film when the etchback is performed on the nitride film 44. In this process, the floating gate 41 is completely covered by the nitride film.

Figure 16A:
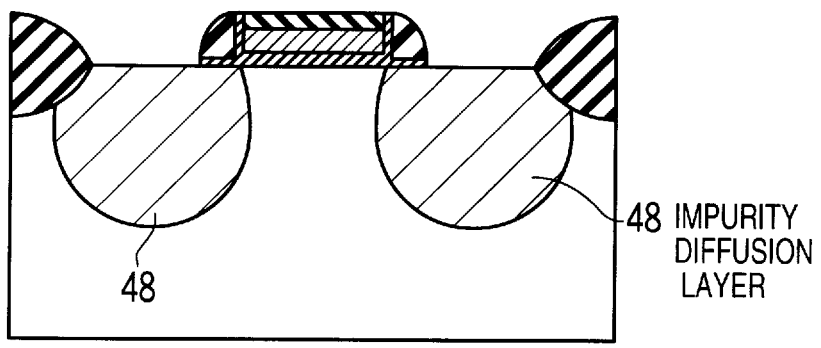
FIG. 16A is a section view showing still another process of manufacturing the third embodiment of the flash memory in the present invention, following FIG. 15D.

Next, as shown in FIG. 16A, the arsenic is implanted with this nitride film as the mask, similarly to the embodiment 1. The condition noted in the embodiment 1 can be utilized as a condition at this time. Here, as an example, the ion implantation is performed under conditions of an acceleration energy 30 keV and a dose amount of $1 \times 10^{15}$ cm$^{-2}$ in a process of implanting under a low acceleration energy, and conditions of an acceleration energy of 200 keV and a dose amount of $5 \times 10^{15}$ cm$^{-2}$ in a process of implanting under a high acceleration energy.

Continuously, an impurity diffusion layer (a source/drain region) 48 serving as a bit line is formed by the diffusion in $N_2$ atmosphere at a temperature of, for example, 900° C. At this time, the impurity diffusion layer 48 is pushed (advanced) under the nitride film side wall 45 by the thermomigration of the implanted impurity, and simultaneously a deep impurity diffusion layer is formed in the substrate, in this embodiment. This condition of the thermal annealing may be properly changed into one selected from the conditions explained in the embodiment 1.

Figure 16B:
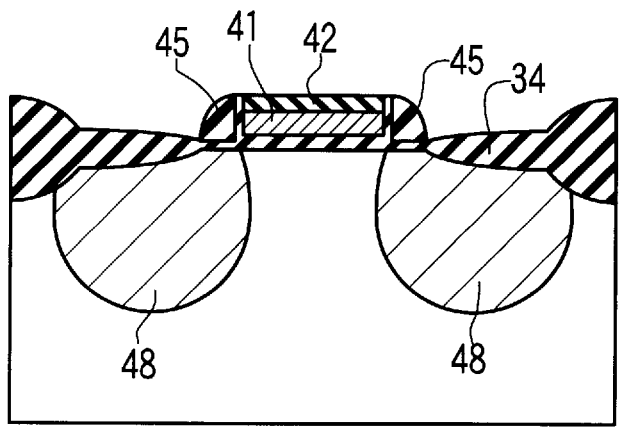
FIG. 16B is a section view showing still another process of manufacturing the third embodiment of the flash memory in the present invention.

Next, as shown in FIG. 16B, an oxidation film 34 of, for example, 100 nm is formed on the impurity diffusion layer 48 by thermally oxidizing the substrate with the nitride films 42, 45 as the mask. At the time of this thermal oxidization, the polysilicon 41 of the floating gate is not oxidized since it is covered by the nitride film mask 42.

Figure 16C:
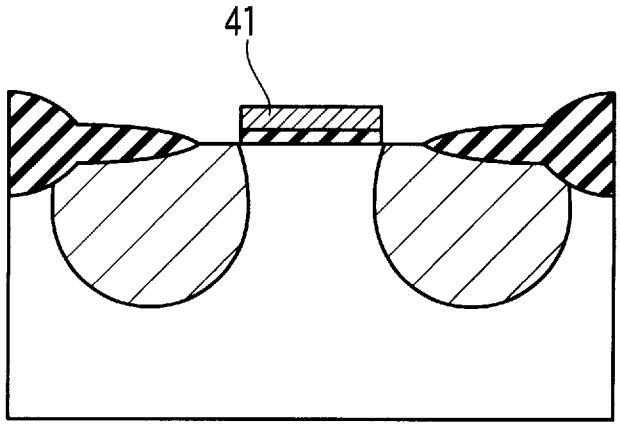
FIG. 16C is a section view showing still another process of manufacturing the third embodiment of the flash memory in the present invention.

After that, as shown in FIG. 16C, the nitride films 42, 45 are removed by the wet etching. The thin oxidation film 42 of an etching stopper covering the floating gate 41 is removed by the wet etching. Accordingly, the surface of the impurity diffusion layer 48 corresponding to the portion in which the nitride film side wall 45 is formed is exposed.

Figure 17A:
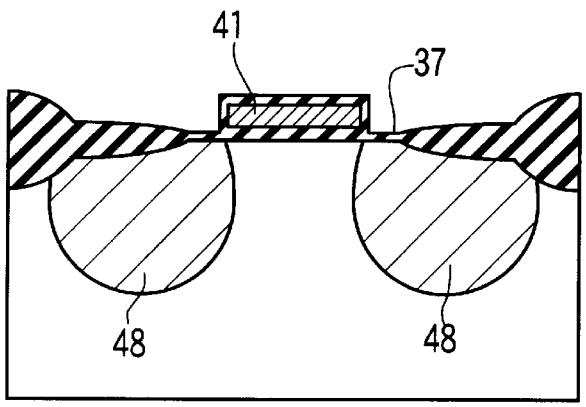
FIG. 17A is a section view showing still another process of manufacturing the third embodiment of the flash memory in the present invention, following FIG. 16C.
Figure 17B:
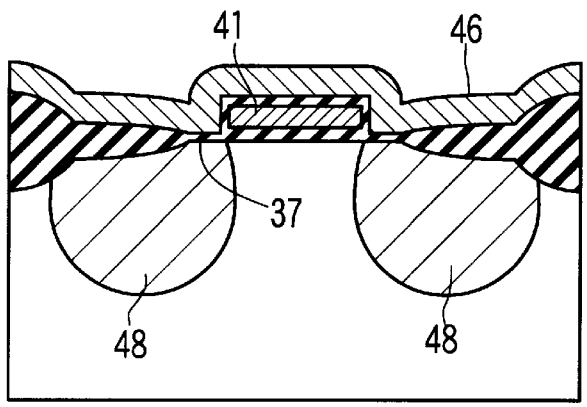
FIG. 17B is a section view showing still another process of manufacturing the third embodiment of the flash memory in the present invention.
Figure 17C:
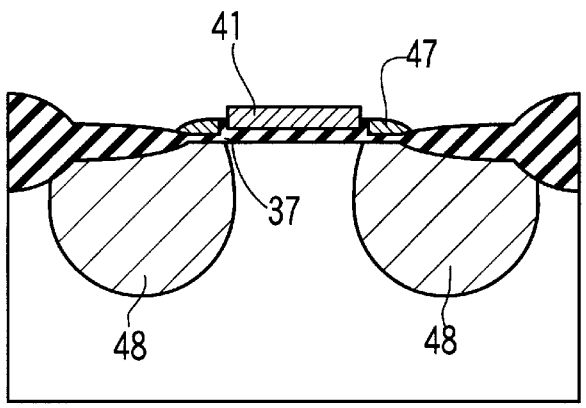
FIG. 17C is a section view showing still another process of manufacturing the third embodiment of the flash memory in the present invention.

Next, as shown in FIG. 17A, a thin oxidation film 37 of, for example, 8 nm is formed on the surface of the impurity diffusion layer 48, by the thermally oxidizing method. A polysilicon layer 46 of, for example, 120 nm is formed on the thin oxidation film 37, by the CVD method, as shown in FIG. 17B. This polysilicon layer 46 is etched back by the anisotropy etching to thereby form a polysilicon side wall 47 shown in FIG. 17C. At this time, the polysilicon side wall 47 is formed to perfectly cover the thin oxidation film region 37 of 8 nm on the impurity diffusion layer 48. Then, the oxidation film formed on the floating gate 41 is removed by the wet etching.

Figure 18A:
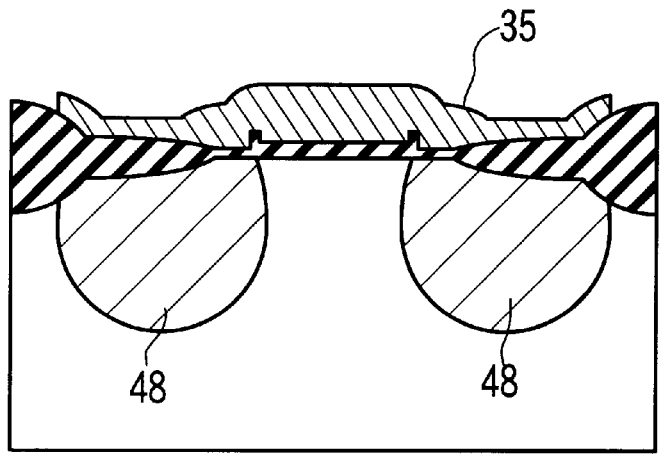
FIG. 18A is a section view showing still another process of manufacturing the third embodiment of the flash memory in the present invention, following FIG. 17C.

Next, as shown in FIG. 18A, the polysilicon of, for example, 100 nm is formed and patterned on the entire surface by the CVD method to form a polysilicon layer 35 in which the floating gate 41 and the polysilicon side wall 47 are integrated with each other.

Figure 18B:
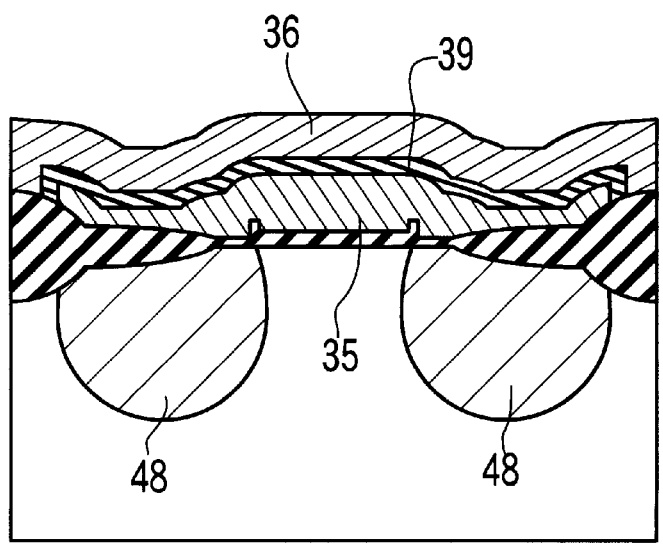
FIG. 18B is a section view showing still another process of manufacturing the third embodiment of the flash memory in the present invention.

Next, as shown in FIG. 18B, a inter-layer insulating film 39 of ONO film is formed on the polysilicon layer 35, and then a control gate 36 formed of polysilicon is formed on the interlayer insulating film 39, and finally the flash memory in this embodiment is completed.

[Embodiment 4]

Figure 19A:
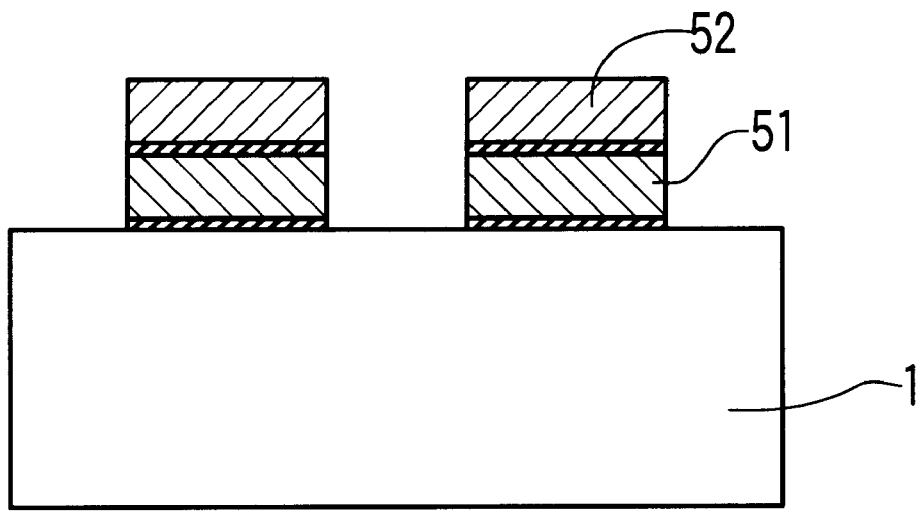
FIG. 19A is a section view showing one process of manufacturing a fourth embodiment of the flash memory in the present invention.
Figure 19B:
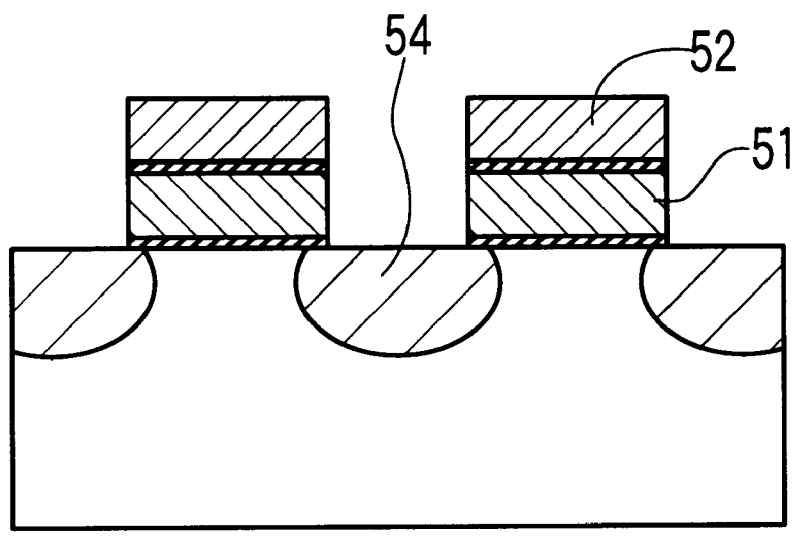
FIG. 19B is a section view showing another process of manufacturing the fourth embodiment of the flash memory in the present invention.

In the embodiment 3, the ion implantation is performed after the formation of the nitride film side wall 45, as shown in FIG. 15D. In the embodiment 4, a floating gate 51 and a control gate 52 are patterned in predetermined shapes on a silicon substrate 1, as shown in FIG. 19A. After that, the ion implantation is performed with the patterned stack structure as the mask. After that, the thermally annealing enables an impurity diffusion layer 54 to be formed as shown in FIG. 19B. The implantation condition and the thermal annealing condition at this time can be set similarly to the embodiment 1.

The above-mentioned embodiments 1 to 4 have been explained by using the arsenic as the N-type impurity. However, other materials may be used if they are the N-type impurities. For example, phosphorus may be used. Moreover, the phosphorus may be used in one of a plurality of ion implantation operations, and the arsenic may be used in the other of the plurality of ion implantation operations.

According to the present invention, even if the width of the bit line is made thin and the hyperfine structure is created, it is possible to provide the contactless array type nonvolatile memory which can reserve the sufficient ON current without increasing the resistance. Moreover, according to the present invention, it is possible to reduce to the sufficient low resistance to thereby connect a large number of memory cells to a single contact. Hence, the number of contacts can be reduced to thereby create the further hyperfine structure.

What is claimed is:

1. A nonvolatile memory comprising:

a first conductive type of semiconductor region; and a second conductive type of impurity diffusion layer which is formed by doping into a predetermined region of said semiconductor region, impurity of said second conductive type that differs from said first conductive type, said impurity diffusion layer being used as a bit line, wherein said impurity diffusion layer has a specific layer in which an impurity density is substantially equal to or higher than $1 \times 10^{18}$ cm$^{-3}$, and wherein B>A where A is a diffusion length of the predetermined region in a lateral direction from a mask boundary to the boundary of the impurity diffusion layer having an impurity density substantially equal to or higher than $1 \times 10^{18}$ cm$^{-3}$ and B is a thickness of said specific layer in a depth direction.

2. A nonvolatile memory according to claim 1, wherein a thickness of said impurity diffusion layer in a depth direction is larger than half a width of a surface portion of said impurity diffusion layer.

3. A nonvolatile memory according to claim 1, wherein said thickness of said specific layer in said depth direction of said impurity diffusion layer is substantially equal to or higher than 0.25 μm.

4. A nonvolatile memory according to claim 1, wherein said impurity diffusion layer has, in a predetermined position of said impurity diffusion layer in a depth direction, a maximum impurity density portion in which said impurity density of said impurity diffusion layer is maximum.

5. A nonvolatile memory according to claim 4, wherein said maximum impurity density portion is substantially provided in a depth of 0.05 μm or more from a surface portion of said impurity diffusion layer.

6. A nonvolatile memory according to claim 1, wherein a side close to a surface portion of said impurity diffusion layer is lower in impurity density of said impurity diffusion layer than a side away from said surface portion of said impurity diffusion layer.

7. A nonvolatile memory according to claim 4, wherein in said impurity diffusion layer, a width of said impurity diffusion layer in a depth corresponding to said maximum impurity density portion is larger than a width of said impurity diffusion layer on a surface portion of said impurity diffusion layer.

8. A nonvolatile memory according to claim 1, wherein said second conductive type of impurity is arsenic.

9. A nonvolatile memory comprising:

a first conductive type of semiconductor layer; and a plurality of impurity diffusion layers which are formed on said first conductive type of semiconductor layer to transmit a signal, wherein said first conductive type of semiconductor layer is constructed to prevent punch through where the depletion layers are connected to each other when said signal is transmitted in each of said plurality of impurity diffusion layers.

10. A nonvolatile memory according to claim 9, wherein a thickness of said impurity diffusion layer in a depth direction is larger than half a width on a surface portion of said impurity diffusion layer.

11. A nonvolatile memory according to claim 9 or 10, wherein said impurity diffusion layer has, in a predetermined position of said impurity diffusion layer at a particular depth below the surface of said impurity diffusion layer, a maximum impurity density portion in which said impurity density of said impurity diffusion layer is maximum.

12. A nonvolatile memory according to claim 9, wherein a side close to a surface portion of said impurity diffusion layer is lower in impurity density of said impurity diffusion layer than a side away from said surface portion of said impurity diffusion layer.

13. A nonvolatile memory according to claim 11, wherein said impurity diffusion layer has a first width at a depth corresponding to said maximum impurity density portion and a second width corresponding to the surface portion of said impurity diffusion layer wherein the first width is larger than the second width.

* * * * *